(12) United States Patent
Cheng et al.

(10) Patent No.: US 12,262,650 B1
(45) Date of Patent: Mar. 25, 2025

(54) TEMPERATURE SENSING AND COMPUTING DEVICE AND ARRAY BASED ON TAOX ELECTRONIC MEMRISTOR

(71) Applicant: HUAZHONG UNIVERSITY OF SCIENCE AND TECHNOLOGY, Hubei (CN)

(72) Inventors: Xiaomin Cheng, Hubei (CN); Lijuan Cao, Hubei (CN); Yunhao Luo, Hubei (CN); Jiaqi Li, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/760,041

(22) Filed: Jul. 1, 2024

Related U.S. Application Data

(63) Continuation of application No. PCT/CN2023/130398, filed on Nov. 8, 2023.

(30) Foreign Application Priority Data

Sep. 27, 2023 (CN) .......................... 202311272095.8

(51) Int. Cl.
  *H10N 70/20* (2023.01)
  *H10B 63/00* (2023.01)
  *H10N 70/00* (2023.01)

(52) U.S. Cl.
  CPC ........... *H10N 70/861* (2023.02); *H10B 63/80* (2023.02); *H10N 70/24* (2023.02); *H10N 70/841* (2023.02); *H10N 70/8833* (2023.02)

(58) Field of Classification Search
  CPC ............. H10N 70/861; H10N 70/8833; H10N 70/841; H10B 63/80
  See application file for complete search history.

(56) References Cited

U.S. PATENT DOCUMENTS

2022/0278274 A1*  9/2022  Offrein ................ H10N 70/826

FOREIGN PATENT DOCUMENTS

| CN | 115295544 | 11/2022 |
|---|---|---|
| CN | 115585901 | 1/2023 |

(Continued)

OTHER PUBLICATIONS

"International Search Report (Form PCT/ISA/210) of PCT/CN2023/130398", mailed on May 30, 2024, pp. 1-4.

(Continued)

*Primary Examiner* — Mark V Prenty
(74) *Attorney, Agent, or Firm* — JCIPRNET

(57) ABSTRACT

Disclosed is a temperature sensing and computing device and array based on $TaO_x$ electronic memristor, including a first metal layer, a function layer, and a second metal layer sequentially stacked from bottom to top; a work function of a metal material in the first metal layer is higher than a work function of a metal material in the second metal layer; the function layer is $TaO_x$ material; the first metal layer is grounded, and positive and negative voltages are applied to the second metal layer; in which an output current when the negative voltage is applied to the second metal layer is greater than an output current when the positive voltage of the same magnitude is applied to the second metal layer, and there is a self-rectifying effect; when the voltage of the same magnitude is applied to the second metal layer, the output current increases as a temperature increases.

7 Claims, 4 Drawing Sheets

(56) References Cited

FOREIGN PATENT DOCUMENTS

| | | |
|---|---|---|
| CN | 116171048 | 5/2023 |
| CN | 116723757 | 9/2023 |
| JP | 2004164050 | 6/2004 |
| WO | 2021128994 | 7/2021 |

OTHER PUBLICATIONS

"Written Opinion of the International Searching Authority (Form PCT/ISA/237) of PCT/CN2023/130398", mailed on May 30, 2024, with English translation thereof, pp. 1-10.

* cited by examiner

TEMPERATURE SENSING AND COMPUTING DEVICE AND ARRAY BASED ON TAOX ELECTRONIC MEMRISTOR

CROSS-REFERENCE TO RELATED APPLICATION

This application is a continuation of international application of PCT application serial no. PCT/CN2023/130398, filed on Nov. 8, 2023, which claims the priority benefit of China application no. 202311272095.8, filed on Sep. 27, 2023. The entirety of each of the above-mentioned patent applications is hereby incorporated by reference herein and made a part of this specification.

BACKGROUND

Technical Field

The disclosure belongs to the field of micro-nano electronic devices, and particularly relates to a temperature sensing and computing device and array based on $TaO_x$ electronic memristor.

Description of Related Art

In recent years, with the rapid development of the Internet of Things, more and more objects are embedded with sensors, edge computing has become increasingly important, and more and more information from various sensors needs to be processed. In conventional architectures, sensors and processing units are separated. The data sensed by the sensor often needs to be converted into digital signals through an analog-to-digital converter and then sent to the processing unit through the storage unit. A large amount of redundant data is involved in the data transmission process, which often leads to high power consumption, high latency, and additional hardware costs. Inspired by the biological neural perception system, a solution of integrated sensing and computing is proposed to solve this problem, which can directly perform computations inside the perception end. The sensor can perform information processing while signals are converted without the involvement of the analog-to-digital converter, which can reduce the transmission of the redundant data.

Temperature is important physical information and one of the important physical quantities perceived in the bionic neural network. However, the commonly used temperature sensing and computing units generally comprise multiple electronic components such as resistors, capacitors, and threshold switching devices, or the temperature sensing device is separated from the information processing unit. Therefore, the temperature sensing and computing array and circuit structure constructed are complex, the manufacturing process is complex, and it is difficult to miniaturize and improve the integration. Moreover, due to the complex array structure, when implementing the sensing and computing functions, the power consumption required is high, the speed is slow, and the latency is high.

Therefore, exploring a highly integrated solution of temperature, sensing, and computing is crucial to the development of the Internet of Things and subsequent bionic artificial neural networks, which can further reduce the size of the sensor end and improve problems caused by the separation of sensing and computing such as complex array and circuit structure, low integration, high power consumption, and high latency.

SUMMARY

In view of the shortcomings of the related art, the purpose of the disclosure is to provide a temperature sensing and computing device and array based on $TaO_x$ electronic memristor, aiming to solve problems caused by the separation of sensing and computing in the existing artificial temperature sensing system such as complex array and circuit structure, low integration, high power consumption, and high latency.

To achieve the above purpose, on the one hand, the disclosure provides a temperature sensing and computing device based on $TaO_x$ electronic memristor, which includes a first metal layer, a function layer, and a second metal layer sequentially stacked from bottom to top.

The work function of the metal material in the first metal layer is higher than the work function of the metal material in the second metal layer; the function layer is made of $TaO_x$ material.

The first metal layer and the second metal layer serve as electrodes. When the first metal layer is used for grounding and the second metal layer is used for applying positive and negative voltages, an output current of the second metal layer when the negative voltage is applied is greater than an output current of the second metal layer when the positive voltage of the same magnitude is applied, and there is a self-rectifying effect. When the voltage of the same magnitude is applied to the second metal layer, the output current increases as a temperature increases.

Further preferably, the material of the first metal layer is one of Pt, Pd, Au, Ni, and ITO; The material of the second metal layer is one of Ti, W, Ag, Cu, Al, Ta, Hf, TaN, TiN, and TiW.

More preferably, the thickness of the first metal layer is 5 nm to 2 μm, the thickness of the function layer is 2 nm to 500 nm, and the thickness of the second metal layer is 5 nm to 2 μm.

On the other hand, the disclosure provides a temperature sensing and computing array based on $TaO_x$ electronic memristor, which includes m first metal layers not intersected with each other and disposed with gaps, function layers, and n second metal layers not intersected with each other and disposed with gaps; the function layer is made of $TaO_x$ material; the first metal layer and the second metal layer are arranged crosswise and not intersected with each other; the work function of the metal material in the first metal layer is higher than the work function of the metal material in the second metal layer;

In the array, m≥1, n≥1, and there are m×n temperature sensing and computing devices in the array.

Further preferably, the size of the function layer is adapted to the size of an overlapping portion of the first metal layer and the second metal layer.

Further preferably, the material of the first metal layer is one of Pt, Pd, Au, Ni, and ITO; the material of the second metal layer is one of Ti, W, Ag, Cu, Al, Ta, Hf, TaN, TiN, and TiW.

More preferably, the thickness of the first metal layer is 5 nm to 2 μm, the thickness of the function layer is 2 nm to 500 nm, and the thickness of the second metal layer is 5 nm to 2 μm.

In general, compared with the related art, the above technical solution conceived by the disclosure has beneficial effects as follows.

The disclosure provides a temperature sensing and computing device and array based on $TaO_x$ electronic memristor, in which the work function of the metal material in the first metal layer is higher than the work function of the metal material in the second metal layer, the device has self-rectifying characteristics and can be used to construct a cross array without the need for a selector device. The device and array structure are simpler, more integrated, and easier for industrial implementation and small-size sensor system application.

The disclosure provides a temperature sensing and computing device and array based on $TaO_x$ electronic memristor, in which when the negative voltage of the same magnitude is applied to the second metal layer, the output current of the device can increase as the temperature increases. One $TaO_x$ electronic memristor device can simultaneously complete the functions of temperature sensing and computing. The array comprising multiple devices completes more complex computation and application functions, which can realize highly integrated temperature sensing and computing functions without the need for redundant temperature sensors or data transmission circuits, and can effectively alleviate problems such as high power consumption and high latency generated in the redundant data transmission process.

DESCRIPTION OF THE EMBODIMENTS

For ease of understanding, the English abbreviations and related technical terms involved in the embodiments of the disclosure are explained and described below.

The disclosure provides a temperature sensing and computing device based on $TaO_x$ electronic memristor, which includes a first metal layer, a function layer, and a second metal layer sequentially stacked from bottom to top; the function layer is made of $TaO_x$ material; the work function of the metal material in the first metal layer is higher than the work function of the metal material in the second metal layer.

Further preferably, the first metal layer and the second metal layer serve as electrodes. An output current when a negative voltage is applied to the second metal layer is greater than an output current when a positive voltage of the same magnitude is applied to the second metal layer, and the device has a self-rectifying effect.

Further preferably, when the voltage of the same magnitude is applied, the output current of the device increases as a temperature increases.

On the other hand, the disclosure provides a temperature sensing and computing array comprising the temperature sensing and computing device based on $TaO_x$ electronic memristor, which includes m first metal layers not intersected with each other and disposed with gaps, a function layer is provided on the first metal layer, and the function layer is $TaO_x$ thin film; n second metal layers not intersected with each other and disposed with gaps are arranged on the function layer; the first metal layer and the second metal layer are arranged crosswise and not intersected with each other; m≥1, n≥1, there are m×n temperature sensing and computing devices based on $TaO_x$ electronic memristor in the array; the work function of the metal material in the first metal layer is higher than the work function of the metal material in the second metal layer.

More specifically, a size of the function layer is adapted to a size of an overlapping portion between the first metal layer and the second metal layer.

More specifically, the work function of the first metal layer is greater than the work function of the second metal layer; the material of the first metal layer is one of Pt, Pd, Au, Ni, and ITO; the material of the second metal layer is one of Ti, W, Ag, Cu, Al, Ta, Hf, TaN, TiN, and TiW.

More specifically, a thickness of the first metal layer is 5 nm to 2 μm, a thickness of the function layer is 2 nm to 500 nm, and a thickness of the second metal layer is 5 nm to 2 μm.

The embodiments of the disclosure are described below together with the drawings in the embodiments of the disclosure.

Example 1

Figure 1:
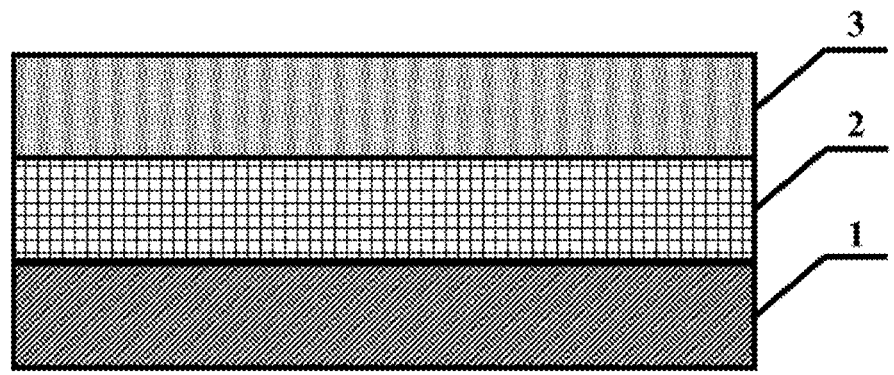
FIG. 1 is a schematic structural diagram of a temperature sensing and computing device based on $TaO_x$ electronic memristor according to an embodiment of the disclosure, where 1 represents a first metal layer, 2 represents a function layer, and 3 represents a second metal layer.

As shown in FIG. 1, an embodiment of the disclosure provides a temperature sensing and computing device based on $TaO_x$ electronic memristor, which includes a first metal layer, a function layer, and a second metal layer stacked sequentially from bottom to top.

In this embodiment, the function layer is $TaO_x$ thin film, in which x=2.085.

In this embodiment, the work function of the first metal layer is greater than the work function of the second metal layer; the material of the first metal layer is Pt; the material of the second metal layer is Ti.

In this embodiment, the thickness of the first metal layer is 100 nm, the thickness of the function layer is 40 nm, and the thickness of the second metal layer is 100 nm.

Figure 2:
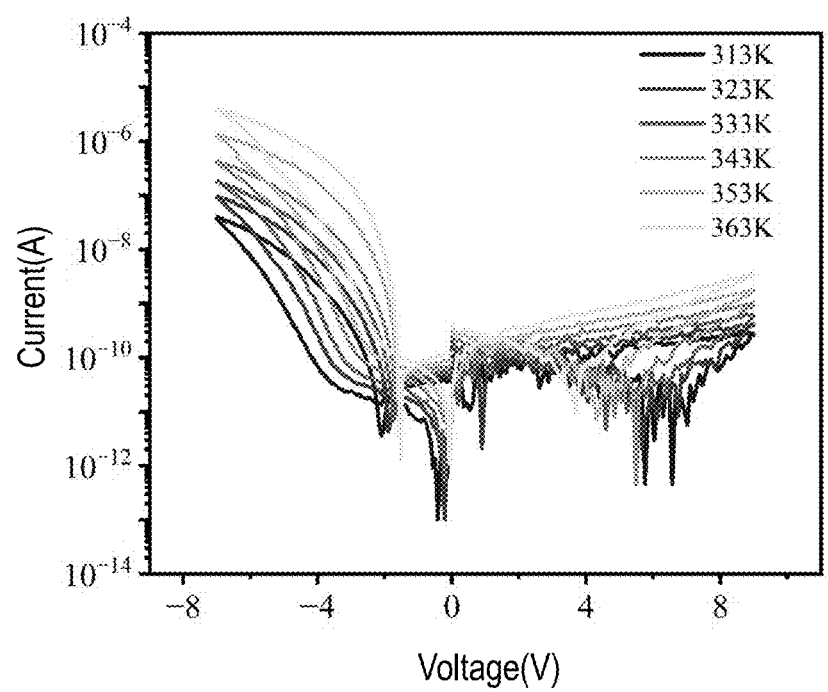
FIG. 2 is an I-V curve diagram obtained by continuous voltage scanning at different temperatures of a Pt/$TaO_x$/Ti temperature sensing and computing device according to an embodiment of the disclosure, and the temperatures are 313 K, 323 K, 333 K, 343 K, 353 K, and 363 K respectively.

FIG. 2 is an I-V curve diagram obtained by continuous voltage scanning at different temperatures of a Pt/$TaO_x$/Ti temperature sensing and computing device according to an embodiment of the disclosure, in which the first electrode is grounded, positive and negative scanning voltages of 0 to 8V are applied to the second electrode, and the temperatures are 313 K, 323 K, 333 K, 343 K, 353 K, and 363 K respectively; at different temperatures, the memristor unit has self-rectifying characteristics in all situations, and a current response thereof increases as the temperature increases. It may be concluded that the Pt/TaO$_x$/Ti device according to the embodiment of the disclosure can be used to construct a cross array due to the self-rectifying characteristics thereof, without the need for additional selector devices, and can achieve perception of different temperatures.

Figure 3:
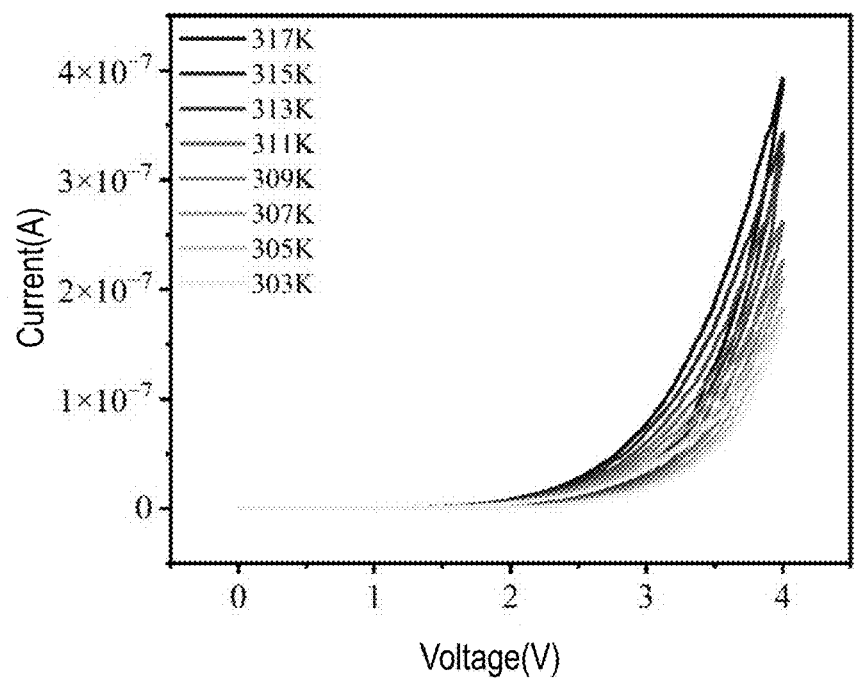
FIG. 3 is an I-V curve diagram obtained by continuous voltage scanning at different temperatures of the Pt/$TaO_x$/Ti temperature sensing and computing device according to an embodiment of the disclosure, and the temperatures are 303 K, 305 K, 307 K, 309 K, 311 K, 313 K, 315 K, and 317 K respectively.

FIG. 3 is an I-V curve diagram obtained by continuous voltage scanning at different temperatures of the Pt/TaO$_x$/Ti temperature sensing and computing device according to an embodiment of the disclosure, in which the first electrode is grounded, and a negative scanning voltage of 0 to 4V is applied to the second electrode. The temperatures are 303 K, 305 K, 307 K, 309 K, 311 K, 313 K, 315 K, and 317 K respectively; at different temperatures, the current response increases as the temperature increases, and the difference between different temperatures is large. Based on the above, it may be concluded that the Pt/TaO$_x$/Ti device according to the embodiment of the disclosure can achieve sensitive perception of temperature, and can correctly identify temperature differences greater than or equal to 2 K.

Figure 4:
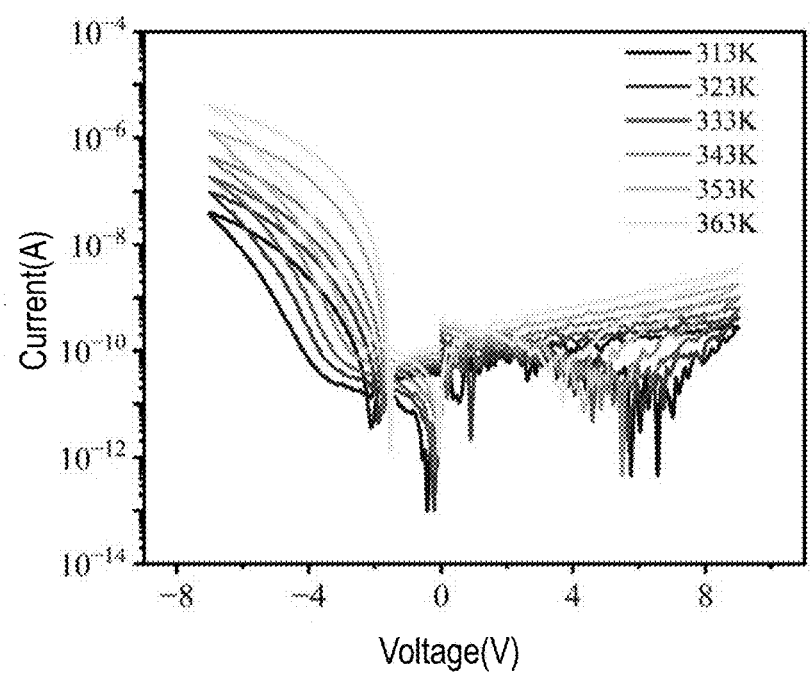
FIG. 4 is a response diagram of ten consecutive pulses at different temperatures of the Pt/$TaO_x$/Ti temperature sensing and computing device according to an embodiment of the disclosure, in which amplitudes of the pulses applied are all −4V, the frequencies are all 3.33 Hz, and the temperatures are 303 K, 305 K, 307 K, 309 K, 311 K, 313 K, 315 K, and 317 K respectively.

FIG. 4 is a response diagram of ten consecutive pulses at different temperatures of the Pt/TaO$_x$/Ti temperature sensing and computing device according to an embodiment of the disclosure, in which amplitudes of the pulses applied are all −4V, the frequencies are all 3.33 Hz, and the temperatures are 303 K, 305 K, 307 K, 309 K, 311 K, 313 K, 315 K, and 317 K respectively. The current response of the device increases as the temperature increases, and a difference between the different temperatures is large. It may be concluded that the Pt/TaO$_x$/Ti device according to the embodiment of the disclosure can also achieve sensitive perception of temperatures when a pulse is applied, and can correctly identify temperature differences greater than or equal to 2 K.

Based on the above electrical measurements, it may be found that: (1) the Pt/TaO$_x$/Ti temperature sensing and computing device has a large current response difference at forward and reverse voltages of the same magnitude, and has self-rectifying characteristics, which is suitable for cross arrays, does not require involvement of selector devices, has a smaller device size, and has fewer steps in the preparation process; (2) whether in DC testing or pulse testing, the current response of the device increases as the temperature increases, which can achieve sensitive perception of temperature, and can identify temperature differences greater than or equal to 2 K.

Example 2

Figure 5:
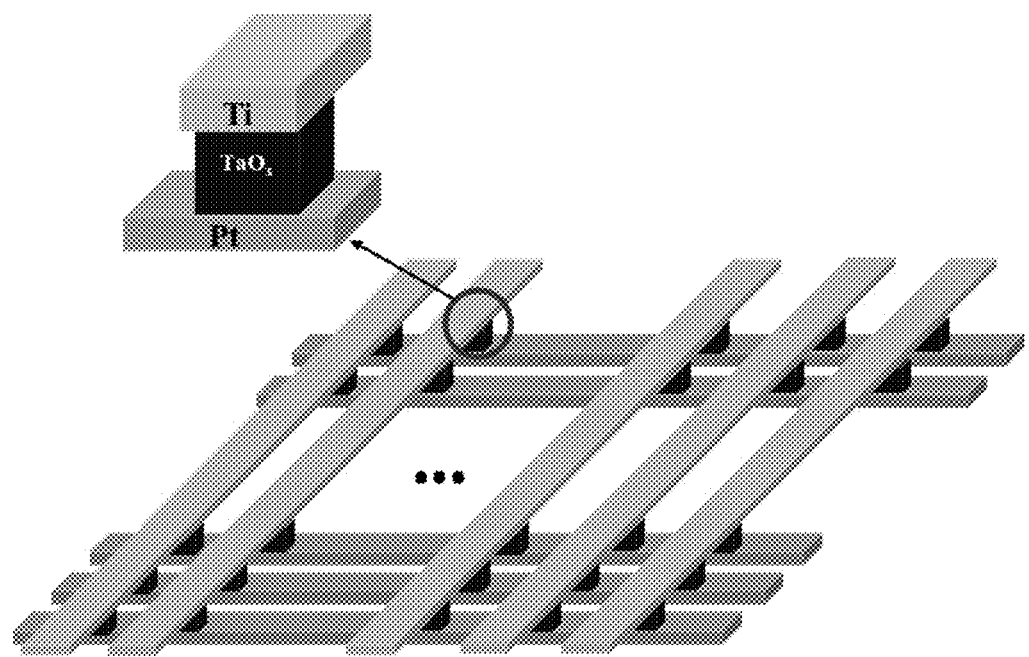
FIG. 5 is a schematic structural diagram of a temperature sensing and computing array based on $TaO_x$ electronic memristor according to an embodiment of the disclosure.

The embodiment of the disclosure provides a temperature sensing and computing array based on TaO$_x$ electronic memristor, and the structural schematic diagram is shown in FIG. 5, which includes 300 second metal layers parallel to each other and disposed with gaps, function layers are disposed on the second metal layers, and 480 first metal layers parallel to each other and disposed with gaps are disposed on the function layers. The first metal layers and the second metal layers are arranged crosswise, and there are 144,000 temperature sensing and computing devices in the array.

In this embodiment, the first metal layer and the second metal layer are arranged perpendicular to each other.

In this embodiment, the size of the function layer is adapted to the size of an overlapping portion between the first metal layer and the second metal layer.

In this embodiment, the temperature sensing and computing device is the device in Example 1.

Example 3

Figure 6:
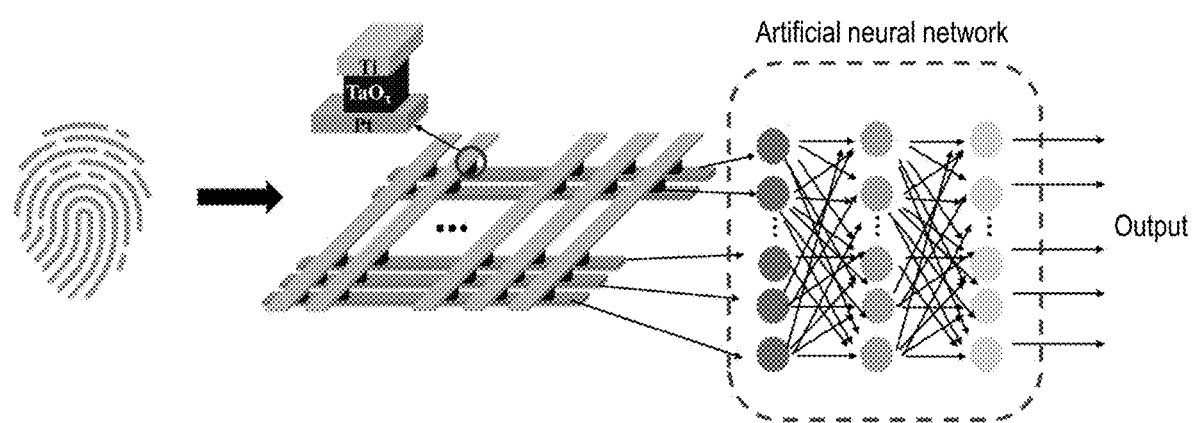
FIG. 6 is a schematic diagram of the temperature sensing and computing array based on $TaO_x$ electronic memristor applied to a fingerprint recognition artificial neural network according to an embodiment of the disclosure.

The embodiment of the disclosure provides an application of a temperature sensing and computing array based on TaO$_x$ electronic memristor in a fingerprint recognition artificial neural network, as shown in FIG. 6.

In this embodiment, the temperature sensing and computing array is the array in Example 2.

In this embodiment, when a finger is placed on the temperature sensing and computing array, the ridge line contacts the array, but the valley line does not contact the array; the array senses the former as human body temperature and the latter as room temperature. By sensing different temperatures of the two lines, reading fingerprint information can be achieved. At the same time, the information read is preprocessed through the cross array and Kirchhoff's law, which reduces redundant circuit systems and transmission of redundant data.

In this embodiment, the pre-processed fingerprint data is passed into a three-layer neural network for fingerprint recognition.

Figure 7:
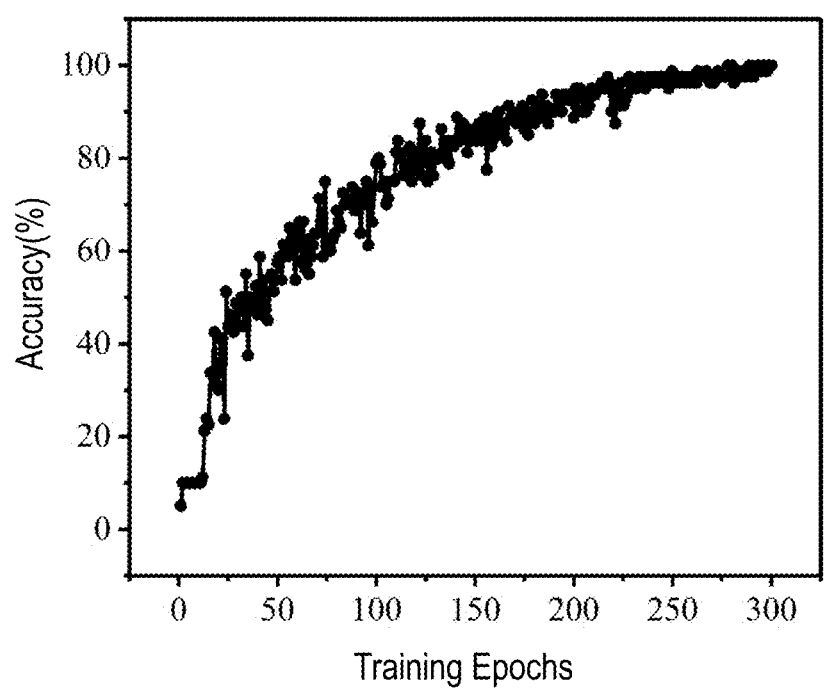
FIG. 7 shows a relationship between a recognition accuracy and training epochs of the temperature sensing and computing array based on $TaO_x$ electronic memristor applied to fingerprint recognition according to an embodiment of the disclosure.

FIG. 7 shows a relationship between a recognition accuracy and the training epochs of the temperature sensing and computing array based on TaO$_x$ electronic memristor applied to fingerprint recognition according to an embodiment of the disclosure. After 300 training epochs, 100% recognition accuracy is achieved, which validates that the array can be used to construct a highly integrated temperature sensing and computing artificial intelligence system.

In summary, compared with related art, the disclosure has advantages as follows.

The disclosure provides a temperature sensing and computing device and array based on TaO$_x$ electronic memristor, in which the work function of the metal material in the first metal layer is higher than the work function of the metal material in the second metal layer, the device has self-rectifying characteristics and can be used to construct a cross array without the need for a selector device. The device and array structure are simpler, more integrated, easier for industrial implementation and small-size sensor system application. Furthermore, when the negative voltage of the same magnitude is applied to the second metal layer, the output current of the device can increase as the temperature increases, which can realize highly integrated temperature sensing and computing functions without the need for redundant temperature sensors or data transmission circuits, and can effectively alleviate problems such as high power consumption and high latency generated in the redundant data transmission process.

The above is only a specific implementation of the disclosure, but the protection scope of the disclosure is not limited thereto. Any technician familiar with the technical field may easily think of changes or substitutions within the technical scope disclosed in the disclosure, which should be covered by the protection scope of the disclosure. Therefore, the protection scope of the disclosure should be based on the protection scope of the appended claims.

What is claimed is:

1. A temperature sensing and computing device based on $TaO_x$ electronic memristor, comprising a first metal layer, a function layer, and a second metal layer sequentially stacked from bottom to top, wherein
a work function of a metal material in the first metal layer is higher than a work function of a metal material in the second metal layer, the function layer is made of $TaO_x$ material;
the first metal layer and the second metal layer serve as electrodes, in response to the first metal layer being configured for grounding and the second metal layer being configured for applying positive and negative voltages, an output current of the negative voltage being applied to the second metal layer is greater than an output current of the positive voltage of same magnitude being applied to the second metal layer, and there is a self-rectifying effect; in response to the voltage of the same magnitude being applied to the second metal layer, the output current increases as a temperature increases,
wherein $x=2.085$.

2. The temperature sensing and computing device according to claim 1, wherein a material of the first metal layer is one of Pt, Pd, Au, Ni, and ITO; a material of the second metal layer is one of Ti, W, Ag, Cu, Al, Ta, Hf, TaN, TiN, and TiW.

3. The temperature sensing and computing device according to claim 1, wherein a thickness of the first metal layer is 5 nm to 2 µm, a thickness of the function layer is 2 nm to 500 nm, and a thickness of the second metal layer is 5 nm to 2 µm.

4. A temperature sensing and computing array based on the temperature sensing and computing $TaO_x$ electronic memristor devices according to claim 1, comprising m first metal layers not intersected with each other and disposed with gaps, function layers, and n second metal layers not intersected with each other and disposed with gaps; wherein the function layer is made of $TaO_x$ material; the first metal layer and the second metal layer are arranged crosswise and not intersected with each other; the work function of the metal material in the first metal layer is higher than the work function of the metal material in the second metal layer; wherein
$m \geq 1$, $n \geq 1$, and there are m×n temperature sensing and computing devices in the array,
wherein $x=2.085$.

5. The temperature sensing and computing array according to claim 4, wherein a size of the function layer is adapted to a size of an overlapping portion between the first metal layer and the second metal layer.

6. The temperature sensing and computing array according to claim 4, wherein a material of the first metal layer is one of Pt, Pd, Au, Ni, and ITO; a material of the second metal layer is one of Ti, W, Ag, Cu, Al, Ta, Hf, TaN, TiN, and TiW.

7. The temperature sensing and computing array according to claim 4, wherein a thickness of the first metal layer is 5 nm to 2 µm, a thickness of the function layer is 2 nm to 500 nm, and a thickness of the second metal layer is 5 nm to 2 µm.

* * * * *